United States Patent
Ogata et al.

(10) Patent No.: US 10,437,151 B2
(45) Date of Patent: Oct. 8, 2019

(54) CATIONICALLY POLYMERIZABLE RESIST UNDERLAYER FILM-FORMING COMPOSITION

(71) Applicant: NISSAN CHEMICAL INDUSTRIES, LTD., Tokyo (JP)

(72) Inventors: Hiroto Ogata, Toyama (JP); Shigeo Kimura, Toyama (JP); Yuki Usui, Toyama (JP); Tomoya Ohashi, Toyama (JP); Takahiro Kishioka, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 95 days.

(21) Appl. No.: 15/563,834

(22) PCT Filed: Mar. 18, 2016

(86) PCT No.: PCT/JP2016/058744
§ 371 (c)(1),
(2) Date: Oct. 2, 2017

(87) PCT Pub. No.: WO2016/158509
PCT Pub. Date: Oct. 6, 2016

(65) Prior Publication Data
US 2018/0081274 A1    Mar. 22, 2018

(30) Foreign Application Priority Data
Mar. 31, 2015 (JP) ................................ 2015-073686

(51) Int. Cl.
*G03F 7/11* (2006.01)
*C08G 59/20* (2006.01)
(Continued)

(52) U.S. Cl.
CPC ................ *G03F 7/11* (2013.01); *C08G 59/20* (2013.01); *C09D 163/00* (2013.01); *G03F 7/091* (2013.01)

(58) Field of Classification Search
None
See application file for complete search history.

(56) References Cited

U.S. PATENT DOCUMENTS

| | | | |
|---|---|---|---|
| 5,540,768 A * | 7/1996 | Yamamoto | C09C 1/648 106/404 |
| 2007/0172759 A1 * | 7/2007 | Ogihara | G03F 7/0752 430/270.1 |

(Continued)

FOREIGN PATENT DOCUMENTS

| | | |
|---|---|---|
| JP | 2006-259482 A | 9/2006 |
| JP | 2007-065161 A | 3/2007 |

(Continued)

OTHER PUBLICATIONS

Jun. 21, 2016 Written Opinion of the International Searching Authority Application No. PCT/JP2016/058744.
(Continued)

*Primary Examiner* — Megan McCulley
(74) *Attorney, Agent, or Firm* — Oliff PLC

(57) ABSTRACT

There is provided a composition for forming a resist underlayer film for lithography that can be used as an underlayer anti-reflective coating that decreases the reflection of irradiated light during exposure from a semiconductor substrate toward the photoresist layer that is formed on the semiconductor substrate and in particular, can be suitably used as a flattening film for flattening a semiconductor substrate having a recess and a project by embedding, in a lithography process for production of a semiconductor device. A resist underlayer film-forming composition for lithography comprising (A) an alicyclic epoxy compound having an alicyclic (Continued)

skeleton and one or more epoxy groups, and a light absorption moiety, in the molecule, (B) a thermal acid generator, and (C) a solvent.

9 Claims, 3 Drawing Sheets

(51) Int. Cl.
    *C09D 163/00*     (2006.01)
    *G03F 7/09*     (2006.01)

(56) References Cited

U.S. PATENT DOCUMENTS

2008/0102649 A1* 5/2008 Takei .................... C08F 220/32
    438/781

2008/0226245 A1* 9/2008 Higuchi ............. C08G 18/0823
    385/127
2016/0218013 A1* 7/2016 Ohashi .................... G03F 7/094

FOREIGN PATENT DOCUMENTS

| | | |
|---|---|---|
| JP | 2007-226204 A | 9/2007 |
| JP | 2008-242492 A | 10/2008 |
| JP | 2010-230773 A | 10/2010 |
| JP | 2014-174428 A | 9/2014 |
| WO | 2006/077748 A1 | 7/2006 |
| WO | 2011/108365 A1 | 9/2011 |

OTHER PUBLICATIONS

Jun. 21, 2016 International Search Report issued in International Application No. PCT/JP2016/058744.

* cited by examiner

CATIONICALLY POLYMERIZABLE RESIST UNDERLAYER FILM-FORMING COMPOSITION

TECHNICAL FIELD

The present invention relates to a cationically polymerizable resist underlayer film-forming composition for lithography that functions as an anti-reflective coating during exposure and can flatten a semiconductor substrate having a recess by embedding using a liquid epoxy compound.

BACKGROUND ART

For example, the formation of a finer resist pattern on a substrate by a photolithography technique including an exposure step using a KrF excimer laser or an ArF excimer laser as a light source as compared with a conventional technique has been known in the production of a semiconductor element. Light of the KrF excimer laser or ArF excimer laser (incident light) incident to a resist film before the formation of the resist pattern is reflected on a surface of the substrate to generate a standing wave in the resist film. Due to the influence of the standing wave, the shape of pattern edge collapses. Therefore, a resist pattern having a desired shape cannot be formed. That is, it is known that the presence of the standing wave can cause variation in dimension of the resist pattern and resolution failure.

In order to suppress the generation of the standing wave, various techniques of providing an anti-reflective coating that absorbs incident light between the resist film and the substrate have been proposed. In particular, an organic anti-reflective coating formed from a light absorbing substance, a polymer, and the like has been variously investigated as the anti-reflective coating from the viewpoint of simple film-forming properties. For example, an anti-reflective coating of acrylic resin having a hydroxy group as a cross-linking reactive group and a light absorbing group in the molecule, and an anti-reflective coating of novolac resin having a hydroxy group as a cross-linking reactive group and a light absorbing group in the molecule have been proposed.

Properties required for the organic anti-reflective coatings include large absorbance to light and radiation; no intermixing with a photoresist layer as an upper layer (insoluble in a photoresist solvent); no diffusion of low molecular weight substance from the anti-reflective coating to the photoresist layer as the upper layer during heating and baking; and a dry etching rate higher than that of a photoresist.

In recent years, in order to solve a problem such as wiring delay in a semiconductor device with advance in refinement of pattern rule in the semiconductor device, a dual damascene process has been investigated as a process for forming a wiring on the semiconductor device. In a substrate in which the process is adopted, a via hole is usually formed. In this case, an anti-reflective coating is formed on the substrate that has a large aspect ratio. When a substrate having a recess on a surface is used in the production of a semiconductor element as described above, it is necessary that the anti-reflective coating have properties of a gap-filling material or a flattening material that can flatten a substrate having a recess by embedding.

For example, Patent Documents 1 and 2 propose an underlayer film-forming composition for lithography containing a compound having a protected carboxyl group and a compound having an epoxy group as a composition that can flatten a substrate having a recess on a surface by embedding.

PRIOR ART DOCUMENTS

Patent Documents

Patent Document 1: Japanese Patent No. 4753046 (WO2006/077748)
Patent Document 2: Japanese Patent No. 5077564 (Japanese Patent Application Publication No. 2008-242492 (JP 2008-242492 A))

SUMMARY OF THE INVENTION

Problem to be Solved by the Invention

With advance in refinement of a semiconductor element, an anti-reflective coating is required to have high embeddability in a recess and flattening properties, in addition to conventionally required properties, as described above. However, the acrylic resin anti-reflective coating conventionally proposed does not sufficiently satisfy the required properties.

In the formation of the conventional anti-reflective coating, a cross-linking reaction using a crosslinker is often adopted. This may result in film shrinkage during curing and an increase in a detachment component, to adversely affect the embeddability in the recess and the flattening properties.

In view of the circumstances, an object of the present invention is to provide an underlayer film-forming composition for lithography usable in the production of a semiconductor device. Specifically, an object of the present invention is to provide an underlayer film for lithography that does not cause intermixing with a photoresist layer to be formed on an upper layer by applying and has a dry etching rate higher than that of the photoresist layer and an underlayer film-forming composition for forming the underlayer film.

In particular, an object of the present invention is to provide a resist underlayer film for lithography that can be used as an underlayer anti-reflective coating that decreases the reflection of irradiated light during exposure from a semiconductor substrate toward the photoresist layer that is formed on the semiconductor substrate and in particular, can be suitably used as a flattening film for flattening a semiconductor substrate having a recess and a project by embedding, in a lithography process for production of a semiconductor device, and an underlayer film-forming composition for forming the underlayer film.

Means for Solving the Problems

The present invention has been intensively studied in order to solve the problems. As a result, the present inventors have found that when as one component of a resist underlayer film-forming composition containing an alicyclic epoxy compound having a multifunctional epoxy group, an alicyclic epoxy compound having an alicyclic skeleton and one or more epoxy groups in the molecule and a light absorption moiety is used, an increase in viscosity is suppressed and high flowability is secured to improve the embeddability, and a film can be formed without use of a crosslinker to suppress film shrinkage, occurrence of a detachment component, and the like. As a result, a cured film having excellent flatness can be formed. Thus, the present invention has been completed.

Specifically, a first aspect of the present invention relates to a resist underlayer film-forming composition for lithography comprising (A) an alicyclic epoxy compound having an alicyclic skeleton and one or more epoxy groups, and a light absorption moiety, in the molecule, (B) a thermal acid generator, and (C) a solvent.

A second aspect of the present invention relates to the resist underlayer film-forming composition for lithography according to the first aspect, further comprising (D) an alicyclic epoxy compound having an alicyclic skeleton and three or more epoxy groups in the molecule (except for a compound corresponding to the alicyclic epoxy compound (A)).

The alicyclic epoxy compound (A) is, for example, a reaction product of at least one compound having an alicyclic skeleton and three or more epoxy groups with at least one compound having at least one moiety selected from the group consisting of a carboxy group, a phenolic hydroxy group, an acid anhydride structure, an amino group, and a thiol group, and a light absorption moiety.

The alicyclic epoxy compound (A) is preferably a reaction product of at least one compound having three or more cycloalkene oxide structures with at least one compound selected from the group consisting of a benzophenone compound, a benzotriazole compound, an aromatic azo compound, a phenyl compound, a naphthalene compound, an anthracene compound, an anthraquinone compound, a triazine compound, a triazinetrione compound, a thiazole compound, a thiadiazole compound, and a quinoline compound that each have at least one moiety selected from the group consisting of a carboxy group, a phenolic hydroxy group, an acid anhydride structure, an amino group, and a thiol group. The cycloalkene oxide structure may be also referred to epoxycycloalkyl group.

The epoxy group of the epoxy compound (A) is, for example, a cycloalkene oxide type epoxy group.

The light absorption moiety of the epoxy compound (A) is preferably a benzyl group, a phenyl group, a naphthyl group, an anthracenyl group, a triazinyl group, a cyanuric group, a thiadiazolyl group, or a thiazolyl group.

A epoxy number of the alicyclic epoxy compound (A) is lower than that of the alicyclic epoxy compound (D).

A third aspect of the present invention relates to the resist underlayer film-forming composition for lithography according to the first aspect, wherein the alicyclic epoxy compound (A) is a compound having a group of the following Formula (X):

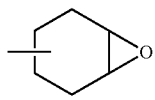

a benzene ring, a naphthalene ring, an anthracene ring, a triazine ring, a cyanuric acid structure, a thiadiazole ring, or a thiazole ring.

A fourth aspect of the present invention relates to the resist underlayer film-forming composition for lithography according to the third aspect, wherein the alicyclic epoxy compound (A) is a compound having the group of the following Formula (X) and a group of the following Formula (Y):

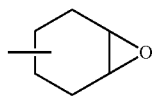

(X)

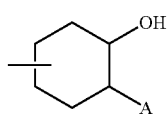

(Y)

(wherein A is a group having a benzene ring, a naphthalene ring, an anthracene ring, a triazine ring, a cyanuric acid structure, a thiadiazole ring, or a thiazole ring).

A fifth aspect of the present invention relates to the resist underlayer film-forming composition for lithography according to the fourth aspect, wherein the alicyclic epoxy compound (A) is a compound containing at least one compound of compounds of the following Formulae (1), (2), and (3):

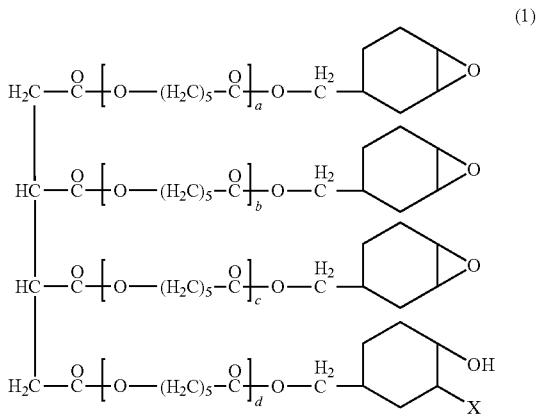

(1)

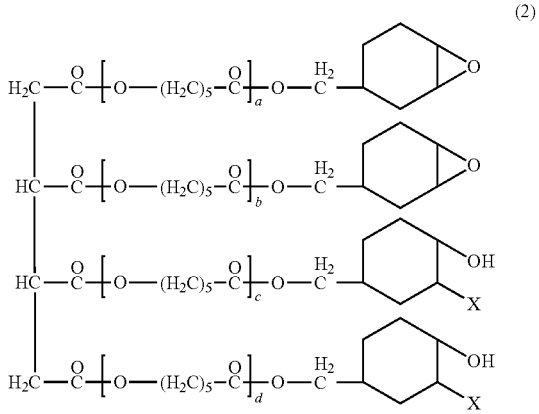

(2)

-continued

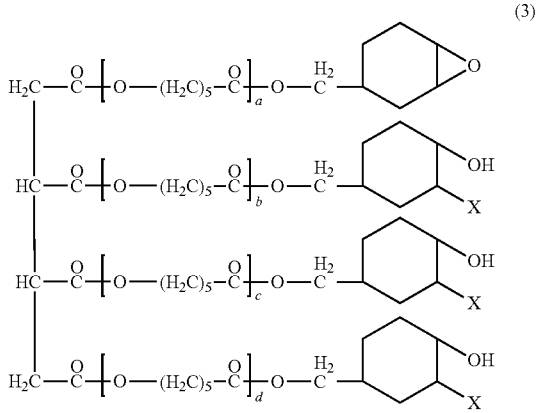

(3)

(wherein a, b, c, and d are each independently an integer of 0 to 30, X is any group of the following Formulae (4), (5), (6), and (7):

(wherein $R_1$ to $R_5$ are each independently a hydrogen atom, a $C_{1-10}$ alkyl group, a $C_{3-6}$ alkenyl group, a benzyl group, a phenyl group, a naphthyl group, an anthracenyl group, a triazinyl group, a cyanuric group, a thiadiazolyl group, or a thiazolyl group, the benzyl group, phenyl group, naphthyl group, anthracenyl group, triazinyl group, cyanuric group, thiadiazolyl group, or thiazolyl group may be substituted with at least one group selected from the group consisting of a $C_{1-10}$ alkyl group, a halogen atom, a $C_{1-10}$ alkoxy group, a nitro group, a cyano group, and a $C_{1-10}$ alkylthio group, and $R_3$ and $R_4$ may form a $C_{3-6}$ ring together with a nitrogen atom to which they are bonded), provided that Xs in Formula (2) or (3) may be the same or different, and X in at least one of Formulae (1) to (3) is a group in which $R_1$ to $R_5$ are each a benzyl group, a phenyl group, a naphthyl group, an anthracenyl group, a triazinyl group, a cyanuric group, a thiadiazolyl group, or a thiazolyl group).

A sixth aspect of the present invention relates to the resist underlayer film-forming composition for lithography according to any one of the first to fifth aspects, further comprising (F) a surfactant.

Effects of the Invention

According to the resist underlayer film-forming composition for lithography of the present invention, an excellent underlayer film that has a dry etching rate higher than that of a photoresist and does not cause intermixing with the photoresist can be provided.

According to the resist underlayer film-forming composition for lithography of the present invention, a surface of a semiconductor substrate having a hole of which the aspect ratio of a height to a diameter is one or more can be flattened.

The resist underlayer film-forming composition for lithography of the present invention has a viscosity lower than that of a conventional resin type film-forming composition in which an acrylic resin or the like is used. Therefore, high filling properties of inside of the hole can be achieved without generation of voids (gaps). Further, the resist underlayer film-forming composition can flatten a recess and a projection of a substrate having a hole by embedding. In addition, the underlayer film can be formed without addition of a crosslinker. For this reason, influence of film shrinkage due to use of the crosslinker can be suppressed. Moreover, the uniformity of film thickness of a photoresist to be formed by coating on the underlayer film, or the like, can be enhanced. Therefore, even by a process using the substrate having a hole, a favorable pattern profile of the photoresist can be formed.

According to the resist underlayer film-forming composition for lithography of the present invention, an underlayer film that can be used as an anti-reflective coating or a flattening film can be formed. Accordingly, a photoresist pattern can be easily formed with high precision by a lithography process in the production of a semiconductor device.

MODES FOR CARRYING OUT THE INVENTION

Figure 1:
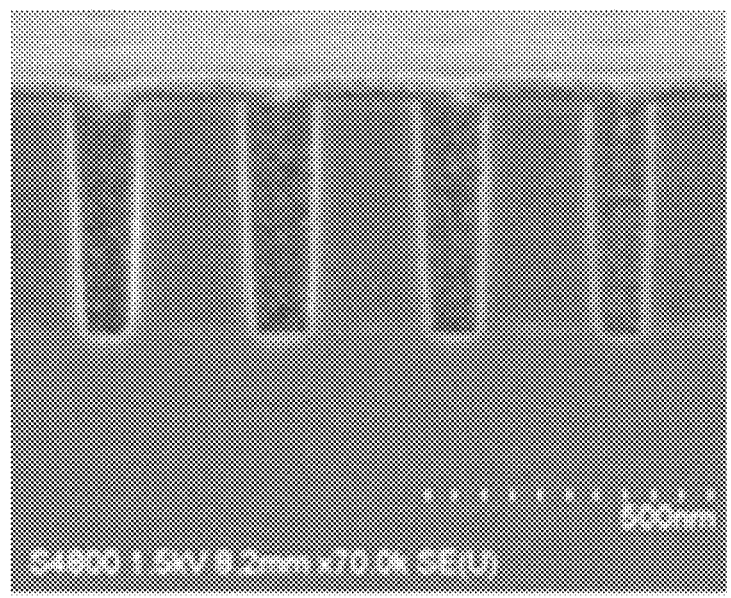
FIG. 1 is a cross-sectional SEM image of a $SiO_2$ wafer in which a hole is filled with a resist underlayer film formed of a resist underlayer film-forming composition of Example 1.

The resist underlayer film-forming composition for lithography of the present invention (hereinafter sometimes simply referred to as resist underlayer film-forming composition) contains (A) an alicyclic epoxy compound having an alicyclic skeleton and one or more epoxy groups, and a light absorption moiety, in the molecule, (B) a thermal acid generator, and (C) a solvent.

The resist underlayer film-forming composition of the present invention may contain as an optional component (D) an alicyclic epoxy compound having an alicyclic skeleton and three or more epoxy groups in the molecule (except for a compound corresponding to the alicyclic epoxy compound (A)), and (F) a surfactant. The resist underlayer film-forming composition may further contain another component such as a photoacid generator and a light absorbing compound.

The ratio of solid content in the resist underlayer film-forming composition of the present invention is not particularly limited as long as the components are uniformly dissolved. For example, the ratio is 0.1% by mass to 70% by mass, 1% by mass to 50% by mass, or 3% by mass to 30% by mass.

Here, the solid content is a total content of the components of the resist underlayer film-forming composition except for the solvent (C), that is, a total content of the components (A), (B), and if desired, (D) and (F), and the other component.

The ratio of the component (A) in the solid content is 70% by mass or more and less than 100% by mass, for example, 80% by mass or more and less than 100% by mass, 80% by mass to 99% by mass, or 90% by mass to 99% by mass.

[(A) Alicyclic Epoxy Compound Having Alicyclic Skeleton and One or More Epoxy Groups, and Light Absorption Moiety in Molecule]

The resist underlayer film-forming composition of the present invention contains an alicyclic epoxy compound having an alicyclic skeleton and one or more epoxy groups, and a light absorption moiety, in the molecule as the component (A).

Examples of the epoxy groups contained in the alicyclic epoxy compound include a cycloalkene oxide type epoxy group (epoxy group having two carbon atoms constituting the alicyclic skeleton) and an epoxy group directly bonded to the alicyclic skeleton. In general, examples of the epoxy group contained in the alicyclic epoxy compound include a glycidyl ether group. However, since use of glycidyl ether type alicyclic epoxy compound tends to cause a decrease in heat resistance, attention should be paid to the use in the present invention.

The light absorption moiety contained in the alicyclic epoxy compound is not particularly limited. For example, the light absorption moiety is a benzyl group, a phenyl group, a naphthyl group, an anthracenyl group, a triazinyl group, a cyanuric group, a thiadiazolyl group, or a thiazolyl group.

For example, the compound of the component (A) is obtained as a reaction product of (a) at least one compound having an alicyclic skeleton and three or more epoxy groups with (b) at least one compound having at least one moiety selected from the group consisting of a carboxy group, a phenolic hydroxy group, an acid anhydride structure, an amino group, and a thiol group, and a light absorption moiety. The compound (a) is preferably a compound having an alicyclic skeleton and 3 or more and 20 or less epoxy groups.

In particular, the compound (a) is preferably a compound having three or more cycloalkene oxide structures, and particularly preferably a compound having 3 or more and 20 or less cycloalkene oxide structures. The compound (a) may be a compound in which the epoxy group is directly bonded to the alicyclic skeleton.

Examples of the compound (a) include, but not limited to, compounds of the following Formulae.

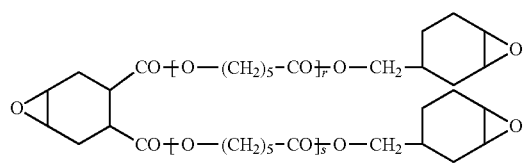

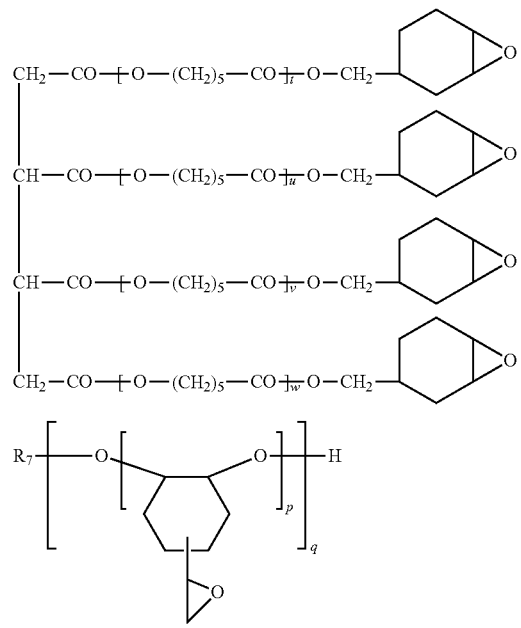

In the formula, $R_7$ is a $C_{2-8}$ alkyl chain, which may be linear or branched, or contain a cyclic structure.

p and q are each independently an integer of 1 to 30, the product of p and q is an integer of 3 or more, and preferably an integer of 3 or more and 20 or less, and r, s, t, u, v, and w are each independently an integer of 0 to 30 in the same compound.

The compound (b) is preferably a compound selected from the group consisting of a benzophenone compound, a benzotriazole compound, an aromatic azo compound, a phenyl compound, a naphthalene compound, an anthracene compound, an anthraquinone compound, a triazine compound, a triazinetrione compound, a thiazole compound, a thiadiazole compound, and a quinoline compound that each have at least one moiety selected from the group consisting of a carboxy group, a phenolic hydroxy group, an acid anhydride structure, an amino group, and a thiol group.

Examples of the compound (b) include, but not limited to, light absorbing compounds of the following Formulae (4a) to (7g).

(4a)

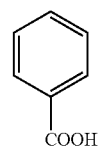

(4b)

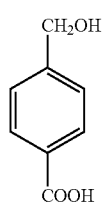
(4c)
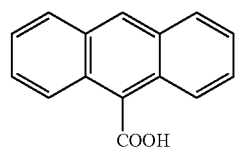
(4l)
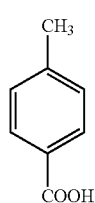
(4d)
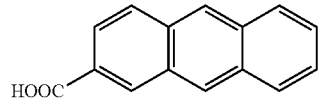
(4m)
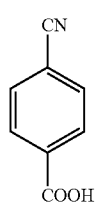
(4e)
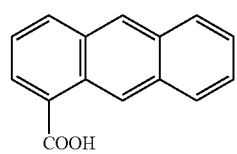
(4n)
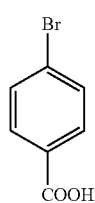
(4f)
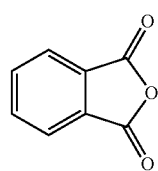
(4o)
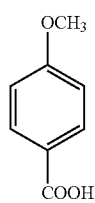
(4g)
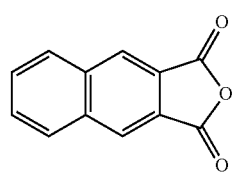
(4p)
(4h)
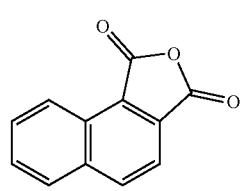
(4q)
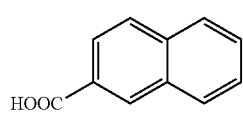
(4i)
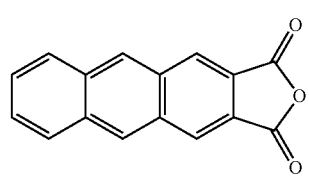
(4r)
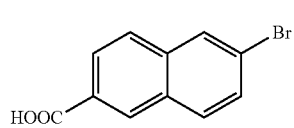
(4j)
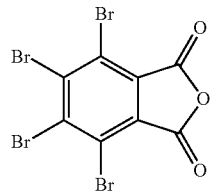
(4s)
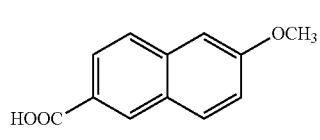
(4k)
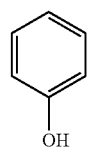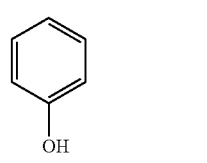
(5a)

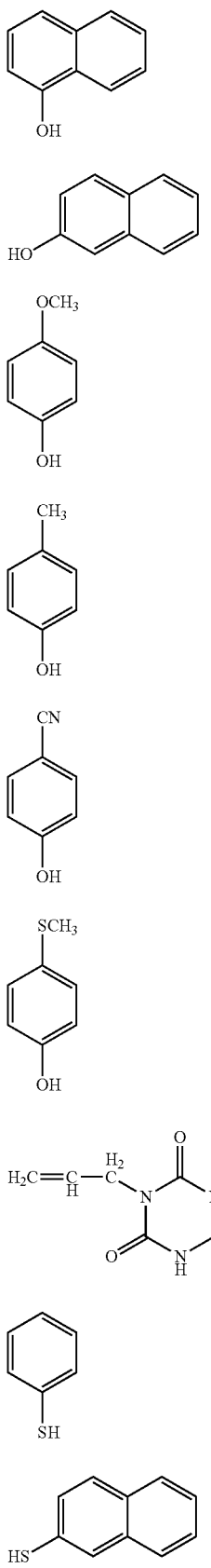
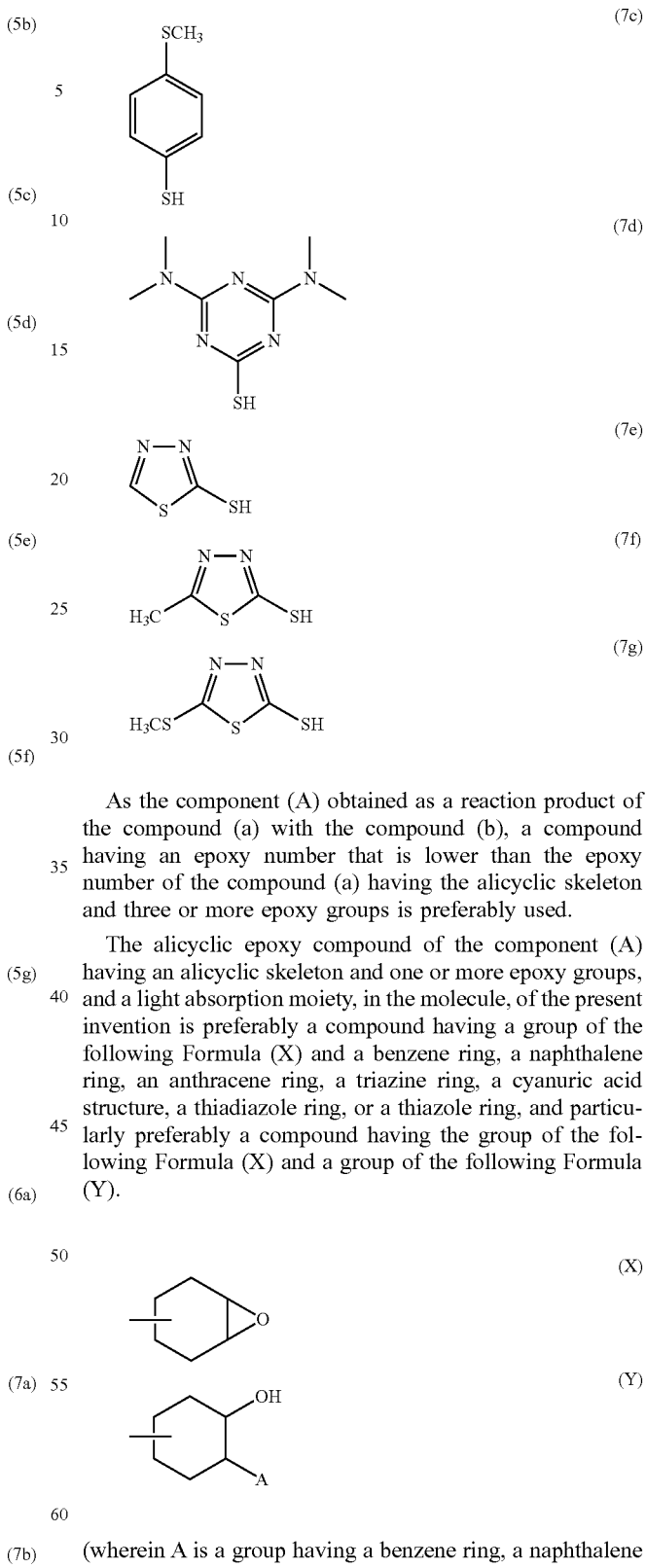

As the component (A) obtained as a reaction product of the compound (a) with the compound (b), a compound having an epoxy number that is lower than the epoxy number of the compound (a) having the alicyclic skeleton and three or more epoxy groups is preferably used.

The alicyclic epoxy compound of the component (A) having an alicyclic skeleton and one or more epoxy groups, and a light absorption moiety, in the molecule, of the present invention is preferably a compound having a group of the following Formula (X) and a benzene ring, a naphthalene ring, an anthracene ring, a triazine ring, a cyanuric acid structure, a thiadiazole ring, or a thiazole ring, and particularly preferably a compound having the group of the following Formula (X) and a group of the following Formula (Y).

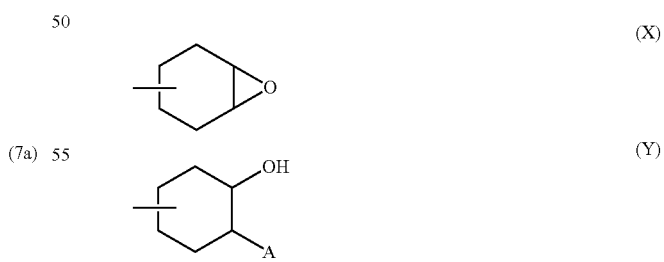

(wherein A is a group having a benzene ring, a naphthalene ring, an anthracene ring, a triazine ring, a cyanuric acid structure, a thiadiazole ring, or a thiazole ring.)

In particular, the compound of the component (A) of the present invention is a compound containing at least one of compounds of the following Formulae (1), (2), and (3).

(1)

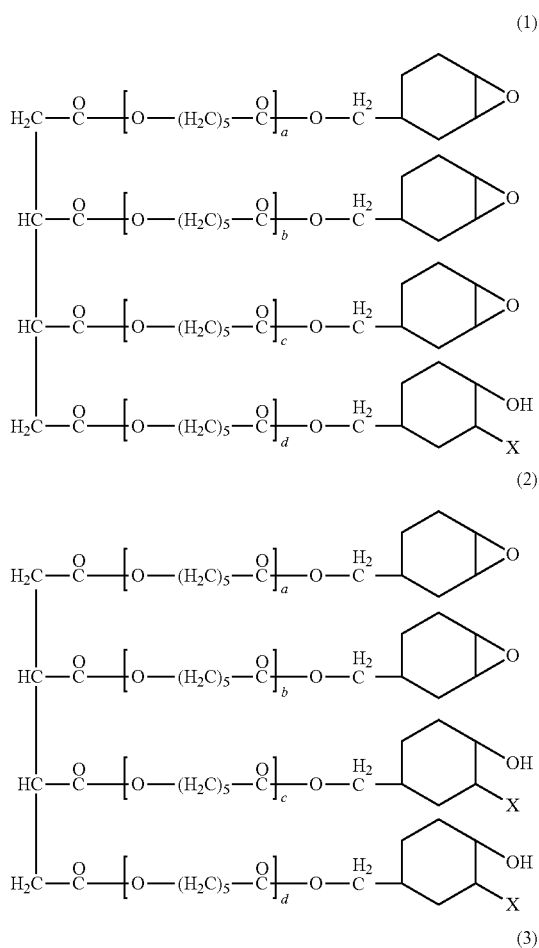

(2)

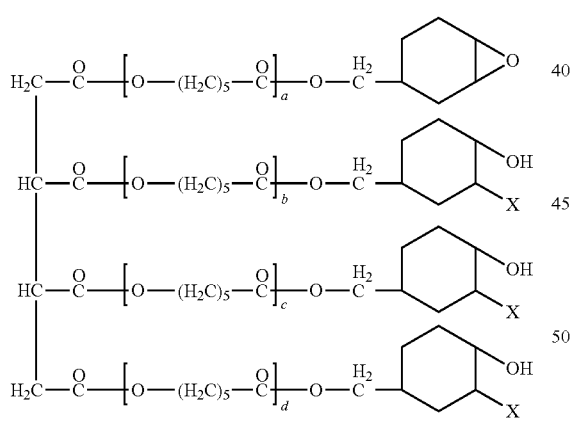

(3)

(In Formulae (1), (2), and (3), a, b, c, and d are each independently an integer of 0 to 30, X is any group of the following Formulae (4), (5), (6), and (7):

(4)

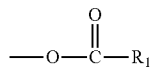

(5)

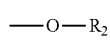

(6)

(7)

(In Formulae (4) to (7), $R_1$ to $R_5$ are each independently a hydrogen atom, a $C_{1-10}$ alkyl group, a $C_{3-6}$ alkenyl group, a benzyl group, a phenyl group, a naphthyl group, an anthracenyl group, a triazinyl group, a cyanuric group, a thiadiazolyl group, or a thiazolyl group, the benzyl group, phenyl group, naphthyl group, anthracenyl group, triazinyl group, cyanuric group, thiadiazolyl group, or thiazolyl group may be substituted with at least one group selected from the group consisting of a $C_{1-10}$ alkyl group, a halogen atom, a $C_{1-10}$ alkoxy group, a nitro group, a cyano group, and $C_{1-10}$ alkylthio group, and $R_3$ and $R_4$ may form a $C_{3-6}$ ring together with a nitrogen atom to which they are bonded), provided that Xs in Formula (2) or (3) may be the same or different and X in at least one of Formulae (1) to (3) is a group in which $R_1$ to $R_5$ are each a benzyl group, a phenyl group, a naphthyl group, an anthracenyl group, a triazinyl group, a cyanuric group, a thiadiazolyl group, or a thiazolyl group.)

In Formulae (1) to (3), X is preferably a group of Formula (4). $R_1$ in Formula (4) that is X in at least one of Formulae (1) to (3) is preferably a phenyl group, a naphthyl group, or an anthracenyl group.

Among the compounds of Formulae (1) to (3), the compounds of Formulae (1) and (2) are preferable, and the compound of Formula (2) is particularly preferable.

For example, the suitable compounds of Formulae (1) to (3) are obtained by a reaction of a compound of the following Formula (8) with benzoic acid, naphthalenecarboxylic acid, or anthracenecarboxylic acid.

(8)

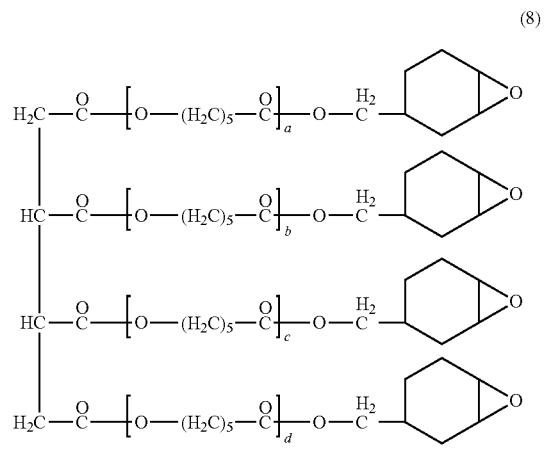

(wherein a, b, c, and d are each independently an integer of 0 to 30.)

Specifically, the suitable compounds of Formulae (1) to (3) are obtained by a reaction of the compound of Formula (8) with benzoic acid, naphthalenecarboxylic acid, or anthracenecarboxylic acid in an appropriate solvent under an appropriate catalyst at a ratio by mole of 90:10 to 30:70, and preferably 80:20 to 40:60.

[(B) Thermal Acid Generator]

The resist underlayer film-forming composition of the present invention contains the thermal acid generator (B) to promote a cross-linking reaction.

Examples of the thermal acid generator include 2,4,4,6-tetrabromocyclohexanedienone, benzoin tosylate, 2-nitrobenzyl tosylate, pyridinium p-toluenesulfonic acid, another organic alkyl sulfonate, and salts thereof. Examples of commercially available products thereof include K-PURE (registered trademark) CXC-1612, CXC-1614, CXC-1742, CXC-1802, TAG-2678, TAG2681, TAG2689, TAG2690, and TAG2700 (available from King Industries, Inc.), and SI-45, SI-60, SI-80, SI-100, SI-110, and SI-150 (available from SANSHIN CHEMICAL INDUSTRY CO., LTD.).

One kind of the thermal acid generator may be used or two or more kinds thereof may be used in combination. For example, the content of the thermal acid generator is 0.01% by mass to 20% by mass, and preferably 0.1% by mass to 10% by mass, relative to the total amount of the epoxy compound of the component (A) or if the component (D) is contained, relative to the total amount of the epoxy compounds of the components (A) and (D).

[(C) Solvent]

The resist underlayer film-forming composition of the present invention contains the solvent (C).

The solvent (C) is not particularly limited as long as it allows the components (A) and (B) described above, the component (D) described below, the surfactant (F), and the other components to be dissolved. As the solvent (C), ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether (PGME), propylene glycol monoethyl ether, propylene glycol monomethyl ether acetate (PGMEA), propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methyl-pyrrolidone, or the like may be used.

The solvent may be used alone or two or more kinds thereof may be used in combination. Further, a solvent having a high boiling point such as propylene glycol monobutyl ether and propylene glycol monobutyl ether acetate is mixed in the aforementioned solvent, and the mixture may be used.

[(D) Alicyclic Epoxy Compound Having Alicyclic Skeleton and Three or More Epoxy Groups in Molecule]

The resist underlayer film-forming composition of the present invention contains as an optional component the alicyclic epoxy compound having an alicyclic skeleton and three or more epoxy groups in the molecule (D) (except for a compound corresponding to the alicyclic epoxy compound (A)).

Examples of the epoxy groups contained in the alicyclic epoxy compound include, as described above, a cycloalkene oxide type epoxy group, an epoxy group directly bonded to the alicyclic skeleton, and a glycidyl ether group. In the present invention, a compound having a cycloalkene oxide type epoxy group or an epoxy group directly bonded to the alicyclic skeleton is preferably used.

The component (D) of the present invention is not particularly limited as long as it is a compound having an alicyclic skeleton and three or more epoxy groups in the molecule. The component (D) is preferably a compound having an alicyclic skeleton and 3 or more and 20 or less epoxy groups in the molecule. In particular, suitable examples thereof include the following compounds.

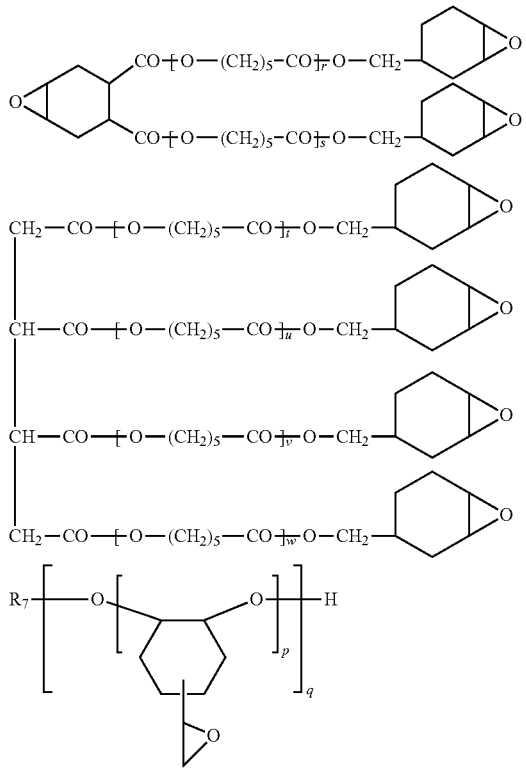

In the formula, $R_7$ is a $C_{2-8}$ alkyl chain, which may be linear or branched, or contain a cyclic structure.

p and q are each independently an integer of 1 to 30, the product of p and q is an integer of 3 or more, and preferably an integer of 3 or more and 20 or less, and r, s, t, u, v, and w are each independently an integer of 0 to 30 in the same compound.

When the component (D) is contained, the ratio of the component (D) in the solid content is less than 30% by mass, for example, 0.01% by mass or more and less than 30% by mass, 0.01% by mass to 20% by mass, or 0.01% by mass to 10% by mass.

[(F) Surfactant]

The resist underlayer film-forming composition of the present invention may contain a surfactant as an optional component to improve application properties to a substrate. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorosurfactants including Eftop (registered trademark) EF301, EF303, and EF352 (available from Mitsubishi Materials Electronic Chemicals Co., Ltd.), MEGAFACE (registered trademark) F171, F173, R-30, R-30N, and R-40-LM (available from DIC Corporation), Fluorad FC430 and FC431 (available from Sumitomo 3M, Ltd.), Asahi-Guard (registered trademark) AG710, and Surflon (registered trademark) S-382, SC101, SC102, SC103, SC104, SC105, and SC106 (available from Asahi Glass Co., Ltd.), and organosiloxane polymer KP341 (available from Shin-Etsu Chemical Co., Ltd.).

The surfactant may be added alone or two or more kinds thereof may be added in combination.

When the surfactant is used, the content of the surfactant is, for example, 0.01% by mass to 5% by mass, and preferably 0.1% by mass to 3% by mass, relative to the total amount of the component (A) or if the component (D) is contained, relative to the total amount of the components (A) and (D).

[Other Component]

To the resist underlayer film-forming composition of the present invention, a photoacid generator may be added as the other optional component to coincide the acidity of a photoresist covering the underlayer film in a lithography process with the acidity of the underlayer film. Examples of the photoacid generator include onium salt compounds, sulfonimide compounds, and disulfonyldiazomethane compounds.

Examples of the onium salt compounds include iodonium salt compounds such as diphenyliodonium hexafluorophosphate, diphenyliodonium trifluoromethanesulfonate, diphenyliodonium nonafluoro-n-butanesulfonate, diphenyliodonium perfluoro-n-octanesulfonate, diphenyliodonium camphorsulfonate, bis(4-tert-butylphenyl)iodonium camphorsulfonate, and bis(4-tert-butylphenyl)iodonium trifluoromethanesulfonate, and sulfonium salt compounds such as triphenylsulfonium hexafluoroantimonate, triphenylsulfonium nonafluoro-n-butanesulfonate, triphenylsulfonium camphorsulfonate, and triphenylsulfonium trifluoromethanesulfonate.

Examples of the sulfonimide compounds include N-(trifluoromethanesulfonyloxy)succinimide, N-(nonafluoro-n-butanesulfonyloxy)succinimide, N-(camphorsulfonyloxy) succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

One kind of the photoacid generator may be used alone, or two or more kinds thereof may be used in combination.

When the photoacid generator is used, the content of the photoacid generator is, for example, 20% by mass or less, 0.01% by mass to 10% by mass, 0.1% by mass to 5% by mass, or 0.5% by mass to 3% by mass, relative to the whole amount of the solid content of the resist underlayer film-forming composition.

As the optional component, the present invention may further contain a light absorbing compound.

As the light absorbing compound, a phenyl compound, a benzophenone compound, a benzotriazole compound, an azo compound, a naphthalene compound, an anthracene compound, an anthraquinone compound, a triazine compound, a triazinetrione compound, a quinoline compound, or the like, can be used. A phenyl compound, a naphthalene compound, an anthracene compound, a triazine compound, or a triazinetrione compound is preferably used.

Among these, a phenyl compound having at least one hydroxy group, amino group, or carboxyl group, a naphthalene compound having at least one hydroxy group, amino group, or a carboxyl group, or an anthracene compound having at least one hydroxy group, amino group, or carboxyl group is preferably used.

Examples of the phenyl compound having at least one hydroxy group, amino group, or carboxyl group include phenol, bromophenol, 4,4'-sulphonyldiphenol, tert-butylphenol, biphenol, benzoic acid, salicylic acid, hydroxyisophthalic acid, phenylacetic acid, aniline, benzylamine, benzyl alcohol, cinnamyl alcohol, phenylalanine, and phenoxypropanol.

Examples of the naphthalene compound having at least one hydroxy group, amino group, or a carboxyl group include 1-naphthalenecarboxylic acid, 2-naphthalenecarboxylic acid, 1-naphthol, 2-naphthol, 1-aminonaphthalene, naphthylacetic acid, 1-hydroxy-2-naphthalenecarboxylic acid, 3-hydroxy-2-naphthalenecarboxylic acid, 3,7-dihydroxy-2-naphthalenecarboxylic acid, 6-bromo-2-hydroxynaphthalene, and 2,6-naphthalenedicarboxylic acid.

Examples of the anthracene compound having at least one hydroxy group, amino group, or a carboxyl group include 9-anthracenecarboxylic acid, 9-hydroxymethylanthracene, and 1-amino anthracene.

In addition to the aforementioned compounds, the compounds of Formulae (4a) to (7g), which are those exemplified as the specific examples in the production of the component (A), may be used.

In the present invention, various additives that are added in the conventional resist underlayer film-forming composition, such as a rheology controlling agent and an adhesion adjuvant, may be added, if necessary, as long as they do not impair the effects of the present invention.

The rheology controlling agent is added to improve mainly the flowability of the resist underlayer film-forming composition, and in particular, to enhance the filling properties of inside of the hole with the underlayer film-forming composition in a baking step. Specific examples thereof include phthalic acid derivatives such as dimethyl phthalate, diethyl phthalate, diisobutyl phthalate, dihexyl phthalate, and butylisodecyl phthalate, adipic acid derivatives such as di-n-butyl adipate, diisobutyl adipate, diisooctyl adipate, and octyldecyl adipate, maleic acid derivatives such as di-n-butyl maleate, diethyl maleate, and dinonyl maleate, oleic acid derivatives such as methyl oleate, butyl oleate, and tetrahydrofurfuryl oleate, and stearic acid derivatives such as n-butyl stearate and glyceryl stearate. The rheology controlling agent is usually mixed in an amount of less than 30% by mass relative to the whole amount of solid content of the resist underlayer film-forming composition.

The adhesive adjuvant is added to mainly improve the adhesion of the substrate or the photoresist to the resist underlayer film-forming composition, and in particular, to prevent peeling of the photoresist in development. Specific examples thereof include chlorosilanes such as trimethylchlorosilane, dimethylvinylchlorosilane, methyl diphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilyl imidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, and urea or thiourea compounds such as 1,1-dimethylurea and 1,3-dimethylurea. The adhesive adjuvant is usually mixed in an amount of less than 5% by mass, and preferably less than 2% by mass, relative to the whole amount of solid content of the resist underlayer film-forming composition.

The resist underlayer film-forming composition of the present invention can be prepared by dissolving the respective components in the solvent (C). The resist underlayer film-forming composition can be used in a homogeneous solution state. It is preferable that the prepared composition be used after filtration through a filter with a pore diameter of 0.02 μm, or the like. The resist underlayer film-forming composition of the present invention has excellent storage stability at room temperature for a long period.

Hereinafter, the use of the resist underlayer film-forming composition of the present invention will be described.

The resist underlayer film-forming composition of the present invention is first applied to a desired semiconductor substrate (e.g., a semiconductor substrate such as a silicon wafer or a germanium wafer that may be coated with a silicon oxide film, a silicon nitride film, or a silicon nitride oxide film) by an appropriate applying method such as a spinner and a coater. The resist underlayer film-forming composition is then baked by a heating means such as a hot plate to form a resist underlayer film.

A baking condition is appropriately selected from a baking temperature of 80° C. to 300° C. and a baking time of 0.3 minutes to 10 minutes. The baking temperature is preferably 120° C. to 250° C. and the baking time is preferably 0.5 minutes to 5 minutes. The formed resist underlayer film has a thickness of 0.005 μm to 3.0 μm, for example, 0.01 μm to 0.1 μm or 0.05 μm to 0.5 μm.

When the temperature during baking is lower than the above-described range, cross-linking is insufficient, intermixing may occur between the resist underlayer film and a resist film to be formed as an upper layer. When the temperature during baking is higher than the above-described range, intermixing may occur between the resist underlayer film and the resist film due to cleavage of cross-linking.

Subsequently, the resist film is formed on the resist underlayer film. The resist film can be formed by a general method, that is, by applying a photoresist solution to the resist underlayer film, followed by baking.

The photoresist solution used in the formation of the resist film is not particularly limited as long as it can be sensitive to a light source used in exposure, and a negative photoresist solution or a positive photoresist solution may be used.

In order to form a resist pattern, exposure through a mask (reticle) in the formation of a predetermined pattern is carried out. For example, a KrF excimer laser or an ArF excimer laser can be used for exposure. After exposure, post exposure bake is carried out, if necessary. A post exposure bake condition is appropriately selected from a heating temperature of 80° C. to 150° C. and a heating time of 0.3 minutes to 10 minutes. After then, the resist pattern is formed through a step of development with an alkaline developer.

Examples of the alkaline developer include an alkaline aqueous solution including an aqueous solution of an alkali metal hydroxide such as potassium hydroxide and sodium hydroxide, an aqueous solution of a quaternary ammonium hydroxide such as tetramethylammonium hydroxide, tetraethylammonium hydroxide, and choline, and an aqueous solution of an amine such as ethanolamine, propylamine, and ethylenediamine. Further, a surfactant or the like can be added to the developer. A development condition is appropriately selected from a development temperature of 5° C. to 50° C. and a development time of 10 seconds to 300 seconds.

EXAMPLES

Hereinafter, specific examples of the resist underlayer film-forming composition of the present invention will be described with reference to the following Synthesis Examples and Examples. The present invention is not limited to the Examples.

A device and the like used in measurement of weight average molecular weight of compounds obtained in the following synthesis Examples are shown.

Device: HLC-8320GPC manufactured by TOSOH CORPORATION)

GPC column: Shodex (registered trademark) Asahipak (registered trademark) (manufactured by Showa Denko K.K.)

Column temperature: 40° C.

Solvent: tetrahydrofuran (THF)

Flow rate: 0.6 mL/min

Standard sample: Polystyrene (available from TOSOH CORPORATION)

Synthesis Example 1

A solution obtained by mixing 100.18 g (30% by mass PGMEA solution) of tetra(3,4-epoxycyclohexylmethyl)butanetetracarboxylate modified ε-caprolactone (product name EPOLEAD GT401 available from Daicel Corporation), 3.1287 g of 9-anthracenecarboxylic acid, 0.0807 g of benzyl tetraethylammonium chloride, and 7.6687 g of propylene glycol monomethyl ether acetate (PGMEA) was warmed to 140° C., and reacted under a nitrogen atmosphere for 24 hours, to obtain a solution containing a compound of the following Formula (A-1) (solid content: 23.3% by mass). The obtained solution containing the compound was analyzed by GPC. The weight average molecular weight in terms of standard polystyrene was about 1,100.

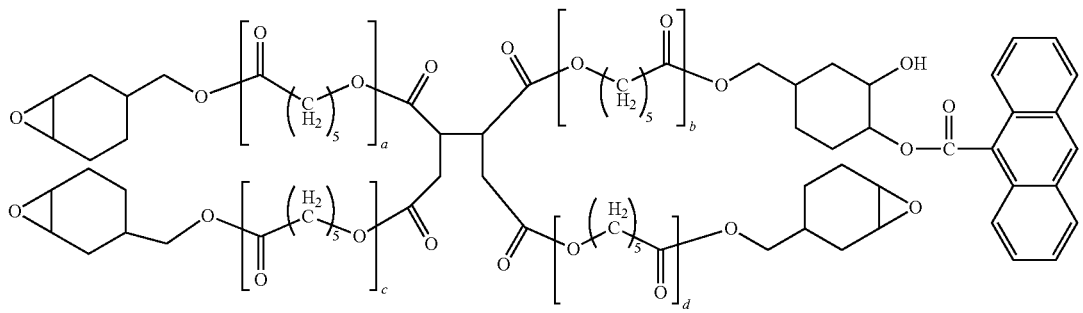

(a + b + c + d) = 1
a, b, c, d 0 or 1

Synthesis Example 2

A solution obtained by mixing 50.00 g (30% by mass PGMEA solution) of tetra(3,4-epoxycyclohexylmethyl)butanetetracarboxylate modified ε-caprolactone (product name EPOLEAD GT401 available from Daicel Corporation), 3.6028 g of 9-anthracenecarboxylic acid, 0.0915 g of benzyl tetraethylammonium chloride, and 8.6164 g of PGMEA was warmed to 140° C., and reacted under a nitrogen atmosphere for 24 hours, to obtain a solution containing compounds of the following Formulae (A-1) to (A-3) (solid content: 26.2% by mass). The obtained solution containing the compounds was analyzed by GPC. The weight average molecular weight in terms of standard polystyrene was about 1,200.

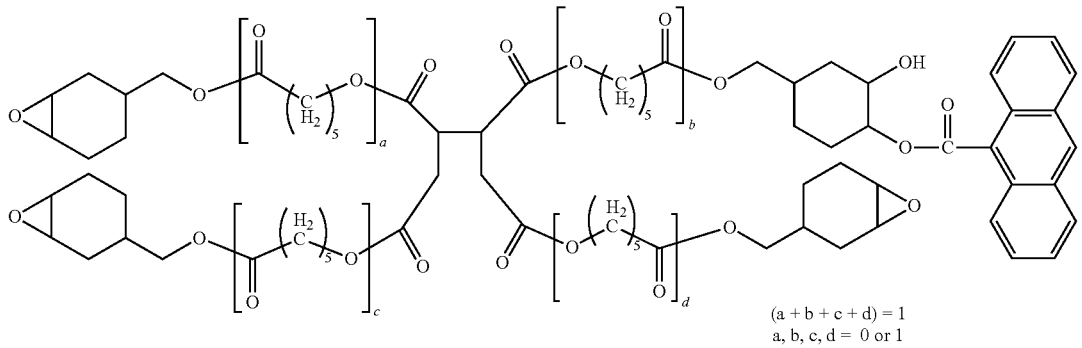

(A-1)

(a + b + c + d) = 1
a, b, c, d = 0 or 1

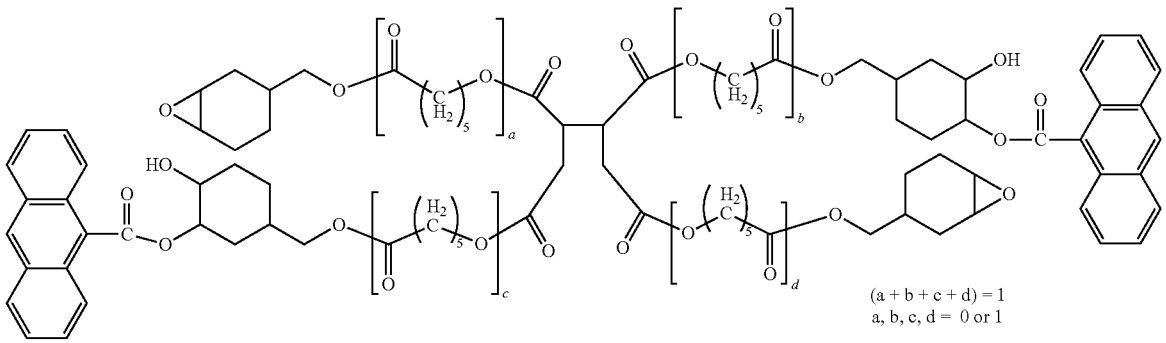

(A-2)

(a + b + c + d) = 1
a, b, c, d = 0 or 1

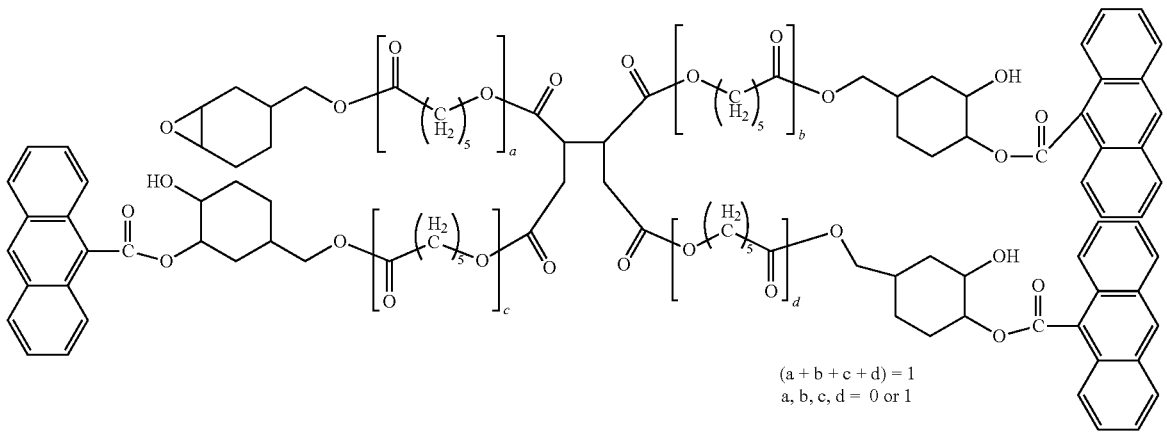

(A-3)

$(a + b + c + d) = 1$
$a, b, c, d = 0 \text{ or } 1$

Synthesis Example 3

3.00 g of glycidyl methacrylate, 26.213 g of 2-hydroxypropyl methacrylate, and 1.753 g of dimethyl 2,2-azobisisobutylate were dissolved in 30.966 g of propylene glycol monomethyl ether, and the mixture was heated. The mixture was added to 77.416 g of propylene glycol monomethyl ether of which the temperature was kept to 90° C. by heating, to cause a reaction for 24 hours. As a result, a solution of copolymer of glycidyl methacrylate with 2-hydroxypropyl methacrylate was obtained.

To 120.00 g of the solution containing 24.00 g of this copolymer, 1.70 g of 9-anthracenecarboxylic acid, 0.046 g of benzyltriethylammonium chloride, and 0.4971 g of propylene glycol monomethyl ether were added, and the mixture was heated to cause a reaction at 120° C. for 24 hours. As a result, a solution containing a copolymer having a structural unit of the following Formula (9) was obtained. The obtained copolymer was analyzed by GPC. The weight average molecular weight in terms of standard polystyrene was 7,000.

methyl methacrylate, and 1.61 g of 9-anthrylmethyl methacrylate to 24.50 g of propylene glycol monomethyl ether acetate, nitrogen was supplied for 30 minutes, and the solution was heated to 80° C. While the temperature of the solution was kept to 80° C., 0.50 g of dimethyl 2,2'-azobis (isobutyrate) was added to the solution. The mixture was stirred at 80° C. under a nitrogen atmosphere for 8 hours to obtain a solution containing a copolymer having a structural unit of the following Formula (10). The obtained copolymer was analyzed by GPC. The weight average molecular weight (in terms of standard polystyrene) was 6,500.

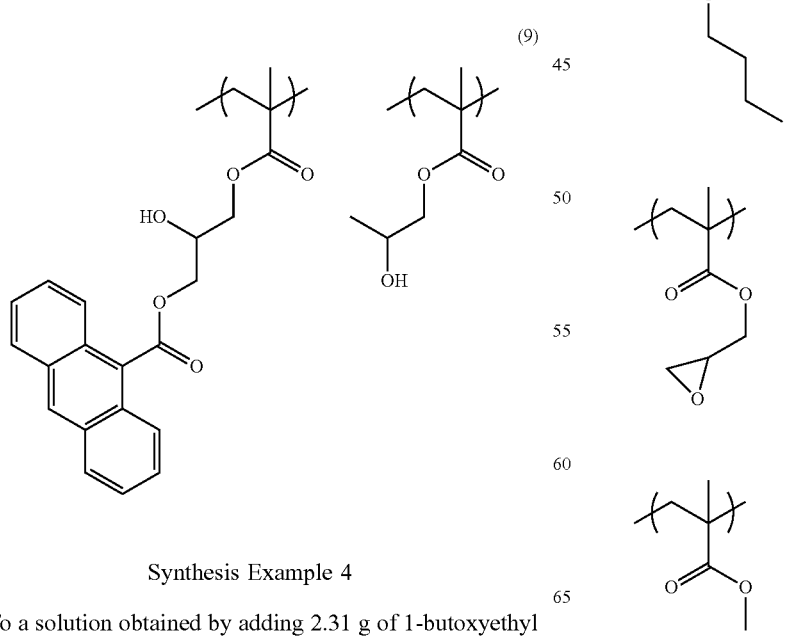

(9)

(10)

Synthesis Example 4

To a solution obtained by adding 2.31 g of 1-butoxyethyl methacrylate, 2.07 g of glycidyl methacrylate, 4.01 g of -continued

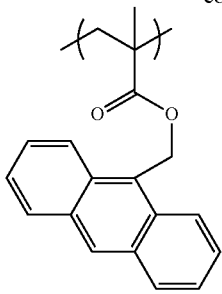

Synthesis Example 5

2.50 g of tris-(2,3-epoxypropyl)-isocyanurate (product name: TEPIC (registered trademark) available from Nissan Chemical Industries, Ltd.), 11.62 g of tetrabromophthalic anhydride (available from Tokyo Chemical Industry Co., Ltd.), and 0.23 g of triphenylmonoethylphosphonium bromide that was a quaternary phosphonium salt as a catalyst were dissolved in 33.48 g of propylene glycol monomethyl ether. Subsequently, the mixture was warmed to 120° C. and stirred under a nitrogen atmosphere for 4 hours. The varnish solution was diluted with 23.91 g of propylene glycol monomethyl ether and analyzed by GPC. The weight average molecular weight in terms of standard polystyrene was 1,491. This reaction product had a structure of the following Formula (11).

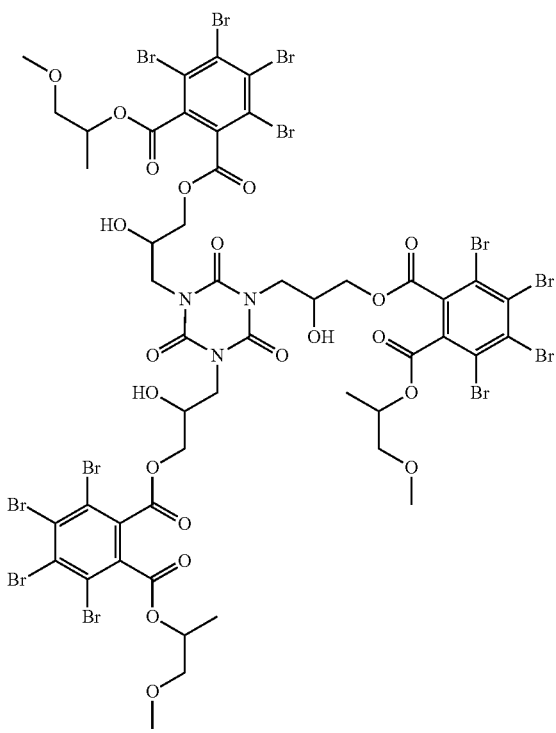

(11)

Example 1

0.035 g of TAG-2689 (available from King Industries, Inc., quaternary ammonium salt of trifluoromethanesulfonic acid) as a thermal acid generator and 81.22 g of PGMEA as a solvent were mixed in 19.5 g of the solution containing 4.4 g of the compound of Formula (A-1) obtained in Synthesis Example 1 (the solvent was PGMEA used in the synthesis), to obtain a 4.4% by mass solution. The solution was filtered through a microfilter made of polytetrafluoroethylene having a pore diameter of 0.2 µm to prepare a resist underlayer film-forming composition.

Example 2

0.016 g of TAG-2689 (available from King Industries, Inc.) as a thermal acid generator and 4.21 g of PGMEA as a solvent were mixed in 0.795 g of the solution containing 0.21 g of the compounds of Formulae (A-1) to (A-3) obtained in Synthesis Example 2 (the solvent was PGMEA used in the synthesis), to obtain a 4.2% by mass solution. The solution was filtered through a microfilter made of polytetrafluoroethylene having a pore diameter of 0.2 µm to prepare a resist underlayer film-forming composition.

Comparative Example 1

0.0079 g of TAG-2689 (available from King Industries, Inc.) as a thermal acid generator and 16.69 g of PGMEA as a solvent were mixed in 3.31 g of solution containing 0.99 g of tetra(3,4-epoxycyclohexylmethyl)butanetetracarboxylate modified ε-caprolactone (product name EPOLEAD GT401 available from Daicel Corporation) (the solvent was PGMEA), to obtain a 5.0% by mass solution. The solution was filtered through a microfilter made of polytetrafluoroethylene having a pore diameter of 0.2 µm to prepare a resist underlayer film-forming composition.

Comparative Example 2

0.4791 g of tetramethoxymethyl glycoluril [POWDERLINK (registered trademark) 1174 available from Nihon Cytec Industries Inc.] as a crosslinker, 0.02556 g of TAG-2689 (available from King Industries, Inc.) as a thermal acid generator and 53.25 g of PGME and 28.89 g of PGMEA as a solvent were mixed in 16.88 g of the solution containing 3.19 g of the copolymer having a structural unit of Formula (9) obtained in Synthesis Example 3 (the solvent was PGME used in the synthesis), to obtain a 3.7% by mass solution. The solution was filtered through a microfilter made of polytetrafluoroethylene having a pore diameter of 0.2 µm to prepare a resist underlayer film-forming composition.

Comparative Example 3

16.42 g of PGMEA as a solvent and 8.55 g of ethyl lactate were mixed in 5.03 g of the solution containing 1.50 g of the copolymer having a structural unit of Formula (10) obtained in Synthesis Example 4 (the solvent was PGMEA used in the synthesis), to obtain a 5.0% by mass solution. The solution was filtered through a microfilter made of polytetrafluoroethylene having a pore diameter of 0.2 µm to prepare a resist underlayer film-forming composition.

Comparative Example 4

1.69 g of tetramethoxymethyl glycoluril [POWDERLINK (registered trademark) 1174 available from Nihon Cytec Industries Inc.] as a crosslinker, 0.084 g of pyridinium p-toluenesulfonate (available from Tokyo Chemical Industry Co., Ltd.) as an acid catalyst, and 9.85 g of PGME and 110.67 g of PGME as a solvent were mixed in 39.38 g of the solution containing 10.13 g of the compound having a structure of Formula (11) obtained in Synthesis Example 5 (the solvent was PGME used in the synthesis), to obtain a 7.0% by mass solution. The solution was filtered through a microfilter made of polytetrafluoroethylene having a pore diameter of 0.2 μm to prepare a resist underlayer film-forming composition.

[Epoxy Number]

The epoxy numbers of the compounds contained in the solutions prepared in Synthesis Examples 1 and 2 that were used in Examples 1 and 2, respectively, and the compound (GT-401) used in Comparative Example 1 were each measured by the following procedure.

Each of 0.25 g of the solution obtained in each of Synthesis Examples or 0.25 g of the compound used in Comparative Example 1 was dissolved in 50 mL of solution of acetic acid/acetone/tetraethyl ammonium bromide (TEAB) (750/750/105% by mass), and to the solution, 0.2 mL of 0.1% by mass crystal violet acetic acid solution was added. Thus, a measurement solution was prepared. This measurement solution was titrated with 0.1 N perchloric acid. A point in which a specified color was changed from blue-violet to blue-green was an end point (titer). These epoxy numbers were calculated by the following expression. The results are shown in Table 1.

Measurement device: automatic titrator GT-1100 available from Mitsubishi Chemical Corporation Expression of epoxy number: Epoxy number in measurement solution={concentration of titration reagent (mol/L)×(titer (mL)/1,000)×$N^*$}/ (Amount of measurement sample (g)/1,000)

*N: number of equivalents of titration reagent per liter of measurement solution (gram equivalent)

Epoxy number of solid content=epoxy number in measurement solution/(solid content of measurement sample (% by mass)/100)

[Elution Test into Photoresist Solvent]

The resist underlayer film-forming composition in each of Examples 1 and 2 and Comparative Example 1 was applied to a silicon wafer by a spinner. The resist underlayer film-forming composition was then baked on a hot plate at 205° C. for 1 minute to form a resist underlayer film (thickness: 0.1 μm).

The silicon wafers each having the resist underlayer film were immersed in propylene glycol monomethyl ether (PGME) and PGMEA that were a solvent generally used as a photoresist solution.

The silicon wafers each having the resist underlayer film were immersed in an alkaline developer for photoresist development (2.38% by mass tetramethylammonium hydroxide aqueous solution).

For the resist underlayer films, a resist underlayer film that was insoluble in the solvent or alkaline developer was evaluated as ○, and a resist underlayer film that was dissolved was evaluated as x. The results are shown in Table 1.

[Test of Optical Parameter]

The resist underlayer film-forming composition in each of Examples 1 and 2 and Comparative Example 1 was applied to a silicon wafer by a spinner. The resist underlayer film-forming composition was then baked on a hot plate of 205° C. for 1 minute to form a resist underlayer film (thickness: 0.1 μm).

The refractive index (n value) and extinction coefficient (k value) of the resist underlayer films were measured at a wavelength of 248 nm by an optical ellipsometer (VUV-VASE VU-302 manufactured by J. A. Woollam Co.). The obtained results are shown in Table 1 below.

It is desirable that the resist underlayer film has a k value of 0.1 or more at a wavelength of 248 nm to have a sufficient anti-reflection function.

[Measurement of Dry Etching Rate]

A resist underlayer film was formed on a silicon wafer by the same method as described above using the resist underlayer film-forming composition in each of Examples 1 and 2 and Comparative Example 1. The dry etching rates of the resist underlayer films were measured using $N_2$ as a dry etching gas by a RIE system manufactured by SAMCO INC.

A photoresist solution (trade name: V146G available from JSR Corporation) was applied to a silicon wafer by a spinner, and baked on a hot plate at 110° C. for 1 minute to form a photoresist film. The dry etching rate of the photoresist film was measured using $N_2$ as a dry etching gas by a RIE system manufactured by SAMCO INC.

The dry etching rate of each of the resist underlayer films was calculated relative to the dry etching rate of the photoresist film taken as 1.00. The results are shown as "selection ratio" in Table 1 blow.

[Measurement of Curing Initiation Temperature]

The resist underlayer film-forming composition in each of Examples 1 and 2 and Comparative Examples 2 to 4 was applied to a silicon wafer by a spinner. The resist underlayer film-forming composition was then baked on a hot plate at a temperature ranging from 80° C. to 170° C. with an interval of 10° C. for 1 minute to form a resist underlayer film (thickness: 0.1 am). The resist underlayer film was immersed in OK73 thinner (available from TOKYO OHKA KOGYO CO., LTD., mixed solution of propylene glycol monomethyl ether and propylene glycol monomethyl ether acetate) as a solvent used in application of photoresist for 1 minute. A temperature at which a remaining film was generated was the curing initiation temperature. Since the resist underlayer film-forming composition in Comparative Example 3 is a self-crosslinkable polymer, a temperature at which the lowest viscosity was shown in measurement of viscosity below was the curing initiation temperature.

[Measurement of Viscosity]

The viscosities of the compounds contained in the solutions prepared in Synthesis Examples 1 and 2 that were used in Examples 1 and 2, respectively, and the compounds prepared in Synthesis Examples 3 to 5 that were used in Comparative Examples 2 to 4, respectively, were each measured by the following procedure.

3 g of the solution prepared in each Synthesis Example was put into a metal cup with a diameter of 40 mm, and baked at 50° C. for 30 minutes, at 100° C. for 60 minutes, and then at 120° C. for 60 minutes, and the solvent was evaporated and removed. Thus, a resin film of each compound (a film-shaped uncured product) was formed. Subsequently, the viscosity at the curing initiation temperature of each of the resin films was measured by a rheometer (MCR102 manufactured by Anton Paar GmbH) with the temperature increased at 5° C./min. The measurement results of viscosity of the resin film of each of the compounds at the curing initiation temperature obtained in [Measurement of Curing Initiation Temperature] are shown in Table 2.

[Measurement of Glass Transition Point (Tg)]

Figure 3:
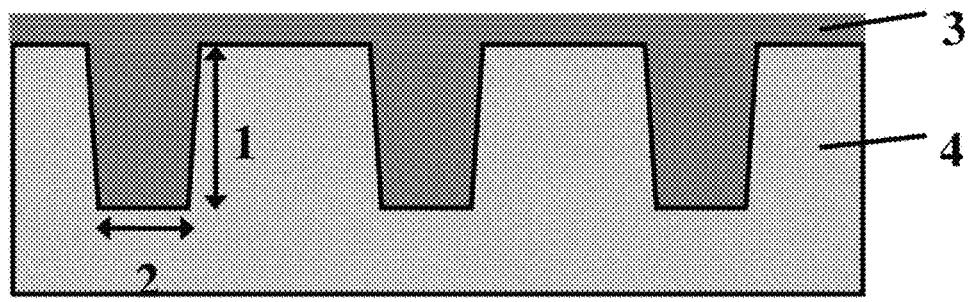
FIG. 3 is a schematic view showing a cross section of a $SiO_2$ wafer used in a test of embeddability in a hole (filling properties) of a resist underlayer film.

The glass transition points of the compounds contained in the solutions prepared in Synthesis Examples 1 and 2 that were used in Examples 1 and 2, respectively, and the compounds prepared in Synthesis Examples 3 to 5 that were used in Comparative Examples 2 to 4, respectively, were each measured by a differential scanning calorimeter (MDSC Q2000 manufactured by TA Instruments Japan Inc.) with the temperature increased at 10° C./min. The obtained results are shown in Table 2.

a pattern in which an distance between the center of each hole and the center of each adjacent hole is 1.5 times the diameter of the holes. As shown in FIG. 3, the depth 1 of each hole of the $SiO_2$ wafer d is 0.4 μm, and the diameter b of each hole is 0.12 μm.

TABLE 1

| | Epoxy number | Solvent resistance | | | Optical parameter (248 nm) | | Etching Selection ratio |
|---|---|---|---|---|---|---|---|
| | | PGME | PGMEA | TMAH※ | n value | k value | |
| Example 1 | 3.36 (Synthesis Example 1) | ○ | ○ | ○ | 1.51 | 0.19 | 1.42 |
| Example 2 | 2.41 (Synthesis Example 2) | ○ | ○ | ○ | 1.47 | 0.48 | 1.33 |
| Comparative Example 1 | 4.60 (GT-401) | ○ | ○ | ○ | 1.59 | 0.00 | 1.53 |

※: 2.38% by mass tetramethylammonium hydroxide aqueous solution

TABLE 2

| | Polymerizable compound | Curing initiation temperature [° C.] | Viscosity [Pa·S]※ | Tg [° C.] |
|---|---|---|---|---|
| Example 1 | Synthesis Example 1 | 150 | $3.5 \times 10^{-1}$ | 1.5 |
| Example 2 | Synthesis Example 2 | 150 | $4.7 \times 10^{-1}$ | 9 |
| Comparative Example 2 | Synthesis Example 3 | 120 | $1.2 \times 10^{3}$ | 68 |
| Comparative Example 3 | Synthesis Example 4 | 120 | $8.1 \times 10^{1}$ | 48 |
| Comparative Example 4 | Synthesis Example 5 | 120 | $1.2 \times 10^{1}$ | 75 |

※Viscosity at curing initiation temperature

As shown in Table 1, the resist underlayer film formed from each of the resist underlayer film-forming compositions in Examples 1 and 2 had a k value of more than 0.1. Therefore, the results show that the resist underlayer films have sufficient anti-reflection function.

However, the resist underlayer film formed from the resist underlayer film-forming composition in Comparative Example 1 had a k value of 0.00, and had no anti-reflection function.

As shown in Table 2, the polymerizable compound used for the resist underlayer film-forming composition of the present invention is liquid at room temperature, the polymer viscosity during initiation of curing of the polymerizable compound largely decreases as compared with the compounds used for the resist underlayer film-forming compositions in Comparative Examples.

[Test of Embeddability (Filling Properties)]

The resist underlayer film-forming composition in each of Examples 1 and 2 was applied to a silicon wafer having a plurality of holes (diameter: 0.12 μm, depth: 0.4 μm) and an $SiO_2$ film on a surface (available from Advantec Co. Ltd., hereinafter abbreviated as $SiO_2$ wafer in the specification) by a spinner. The resist underlayer film-forming composition was then baked on a hot plate at 205° C. for 1 minute to form a resist underlayer film (thickness: 0.1 μm).

FIG. 3 is a schematic view of a $SiO_2$ wafer 3 used in this test and an underlayer film 4 formed on the wafer. The wafer 3 had holes in a dense pattern (Dense). The dense pattern is As described above, the resist underlayer film-forming composition in each of Examples 1 and 2 was applied to the $SiO_2$ wafer and baked to form a resist underlayer film. The cross-sectional shape of the $SiO_2$ wafer was observed by a scanning electron microscope (SEM). The embeddability (filling properties) in the holes of the $SiO_2$ wafer by the resist underlayer film was evaluated. The results are shown in FIG. 1 (Example 1) and FIG. 2 (Example 2).

Figure 2:
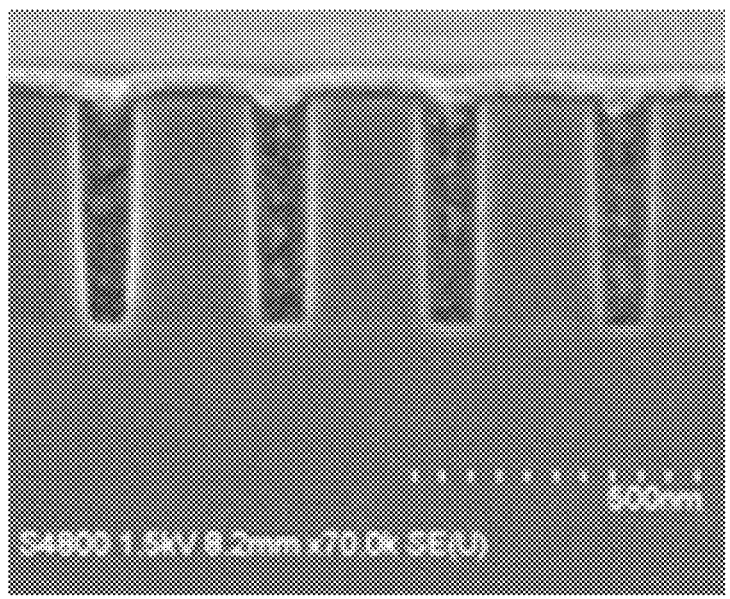
FIG. 2 is a cross-sectional SEM image of a $SiO_2$ wafer in which a hole is filled with a resist underlayer film formed of a resist underlayer film-forming composition of Example 2.

As seen from FIGS. 1 and 2, voids (gaps) inside the holes were not observed, and the holes were filled with the resist underlayer film. Therefore, the resist underlayer film was completely embedded in the whole holes.

[Evaluation of Flattening Properties]

Figure 4:
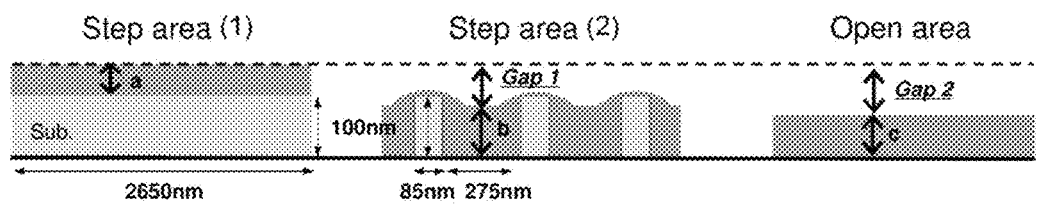
FIG. 4 is a schematic view showing a cross section of a silicon wafer used in an evaluation test of flattening properties and a resist underlayer film formed on the silicon wafer.

The resist underlayer film-forming composition in each of Examples 1 and 2 and Comparative Examples 2 to 4 was applied to a silicon wafer having a plurality of patterns of a step area (1) (width: 2.65 μm, height: 0.1 μm), a step area (2) (width: 85 μm, height: 0.1 μm), an open area and the like, and a $SiO_2$ film on a surface (hereinafter abbreviated as $SiO_2$ wafer 2) by a spinner (see FIG. 4). The resist underlayer film-forming composition was then baked on a hot plate at 205° C. for 1 minute to form a resist underlayer film (thickness: 0.11 μm).

The cross-sectional shape of the resist underlayer film formed as described above was observed by a scanning electron microscope (SEM). As shown in FIG. 4, Gap 1 showing a difference between a height (a+100) from the deepest bottom of the substrate to the uppermost surface of film of the step area (1) and a height b of the film between step patterns in the step area (2), and Gap 2 showing a difference between the height (a+100) from the deepest bottom of the substrate to the uppermost surface of film of the step area (1) and a height c of the uppermost surface of film of the Open area was calculated by the following expression. Thus, the flattening properties of the resist underlayer films from the resist underlayer film-forming compositions in Examples 1 and 2 and Comparative Examples 2 to 4 were evaluated.

Gap1=(a+100 nm)−b

Gap2=(a+100 nm)−c

The obtained results are shown in Table 3.

Figure 5:
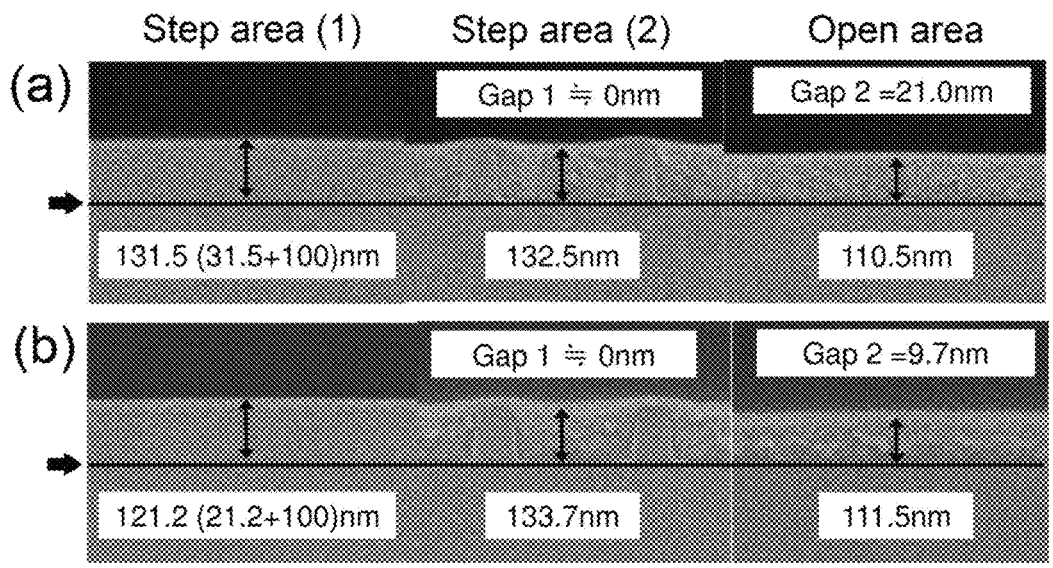
FIG. 5 is a cross-sectional SEM image of the resist underlayer film formed from the resist underlayer film-forming composition of each of Examples 1 and 2 (FIG. 5(a): Example 1, FIG. 5(b): Example 2).
Figure 6:
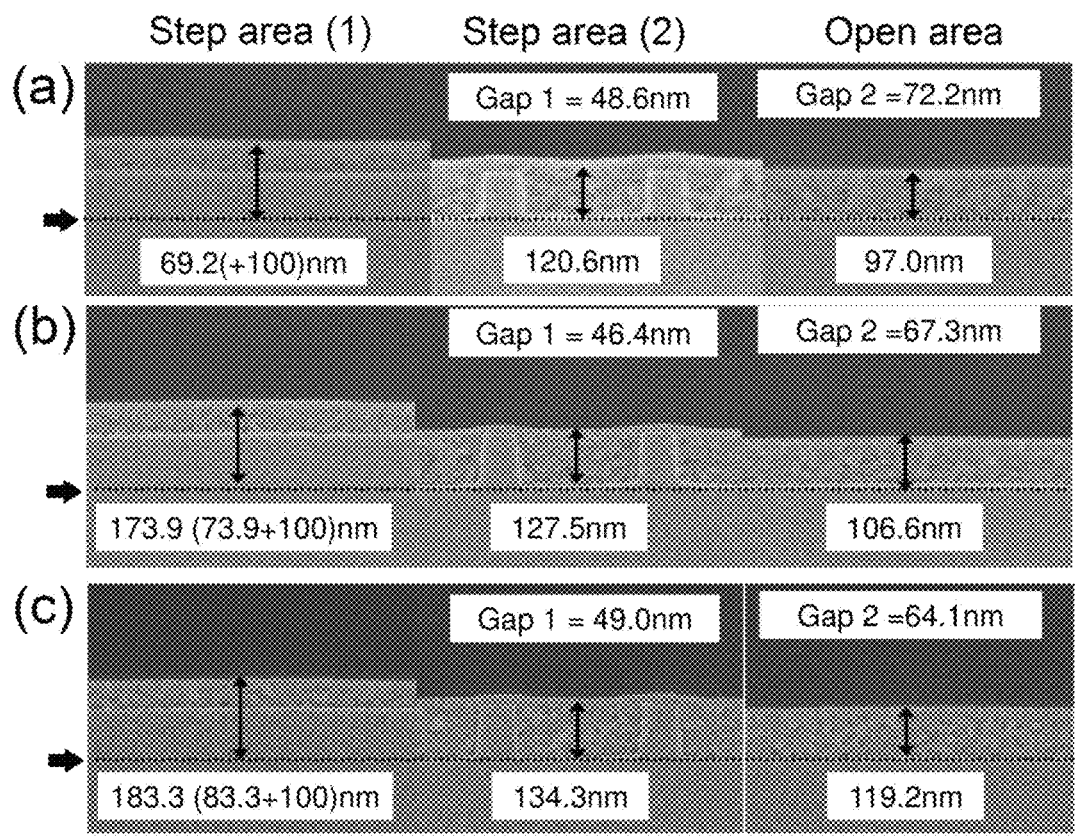
FIG. 6 is a cross-sectional SEM image of a resist underlayer film formed from a resist underlayer film-forming composition of each of Comparative Examples 2 to 4 (FIG. 6(a): Comparative Example 2, FIG. 6(b): Comparative Example 3, FIG. 6(c): Comparative Example 4).

FIG. 5 is a cross-sectional SEM image of the resist underlayer film formed from the resist underlayer film-forming composition in each of Examples 1 and 2 (FIG. 5(a): Example 1, FIG. 5(b): Example 2). FIG. 6 is a cross-sectional SEM image of the resist underlayer film formed from the resist underlayer film-forming composition in each of Comparative Examples 2 to 4 (FIG. 6(a): Comparative Example 2, FIG. 6(b): Comparative Example 3, FIG. 6(c): Comparative Example 4). In each drawing, solid lines (FIG. 5) and dotted lines (FIG. 6) shown by an arrow from the outside of the images show the deepest bottom of the substrate.

TABLE 3

|  | Gap 1 [nm] | Gap 2 [nm] |
|---|---|---|
| Example 1 | ≈0 | 21.0 |
| Example 2 | ≈0 | 9.7 |
| Comparative Example 2 | 48.6 | 97.0 |
| Comparative Example 3 | 46.4 | 67.3 |
| Comparative Example 4 | 49.0 | 64.1 |

In the resist underlayer film-forming composition of the present invention, both Gap1 and Gap2 are small, and the flattening properties are very excellent, as shown in Table 3.

DESCRIPTION OF SYMBOLS

1 depth of hole of SiO$_2$ wafer

2 diameter of hole of SiO$_2$ wafer

3 resist underlayer film

4 SiO$_2$ wafer a thickness of film of step area (1)

b thickness of film between step patterns in step area (2)

c thickness of film in open area

The invention claimed is:

1. A resist underlayer film-forming composition for lithography comprising:
   (A) an alicyclic epoxy compound having an alicyclic skeleton and one or more epoxy groups, and a light absorption moiety, in the molecule, the alicyclic epoxy compound (A) including at least one compound that is a reaction product of:
      (i) at least one compound having at least one moiety selected from the group consisting of a carboxy group, a phenolic hydroxy group, an acid anhydride structure, an amino group, a thiol group, and a light absorption moiety, and
      (ii) at least one of the following compounds having an alicyclic skeleton and three or more epoxy groups:

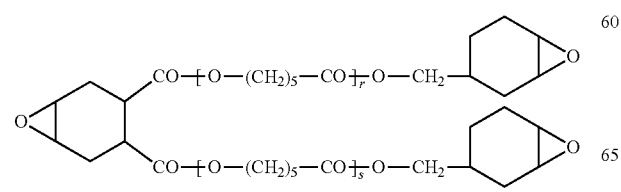

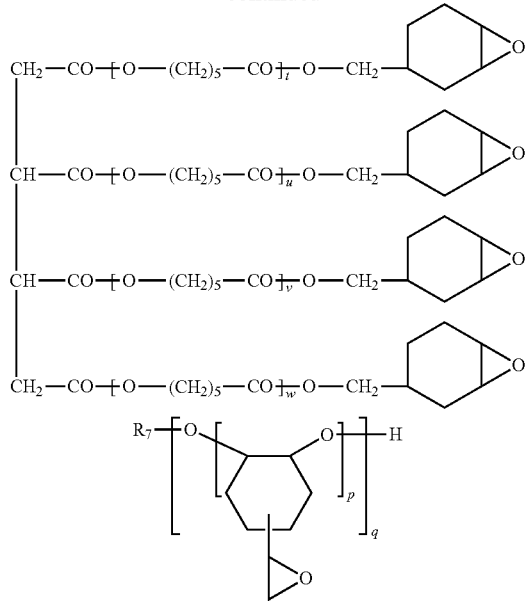

in which
R$_7$ is a C$_{2-8}$ alkyl chain, which is linear or branched, or contains a cyclic structure,
p and q are each independently an integer of 1 to 30,
the product of p and q is an integer of 3 or more, and
r, s, t, u, v, and w are each independently an integer of 0 to 30 in the same compound;
   (B) a thermal acid generator; and
   (C) a solvent.

2. The resist underlayer film-forming composition for lithography according to claim 1, further comprising (D) an alicyclic epoxy compound having an alicyclic skeleton and three or more epoxy groups in the molecule except for a compound corresponding to the alicyclic epoxy compound (A).

3. The resist underlayer film-forming composition for lithography according to claim 2, wherein the alicyclic epoxy compound (A) has an epoxy number lower than the epoxy number of the alicyclic epoxy compound (D).

4. The resist underlayer film-forming composition for lithography according to claim 1, wherein the epoxy group is a cycloalkene oxide epoxy group.

5. The resist underlayer film-forming composition for lithography according to claim 4, wherein the light absorption moiety is a benzyl group, a phenyl group, a naphthyl group, an anthracenyl group, a triazinyl group, a cyanuric group, a thiadiazolyl group, or a thiazolyl group.

6. The resist underlayer film-forming composition for lithography according to claim 1, wherein the alicyclic epoxy compound (A) further comprises:
   a compound having:
      a group of the following Formula (X):

and
a benzene ring, a naphthalene ring, an anthracene ring, a triazine ring, a cyanuric acid structure, a thiadiazole ring, or a thiazole ring.

7. The resist underlayer film-forming composition for lithography according to claim 1, wherein the alicyclic epoxy compound (A) further comprises a compound having the group of the following Formula (X) and a group of the following Formula (Y):

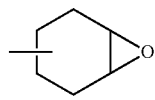
(X)

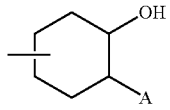
(Y)

wherein A is a group containing a benzene ring, a naphthalene ring, an anthracene ring, a triazine ring, a cyanuric acid structure, a thiadiazole ring, or a thiazole ring.

8. The resist underlayer film-forming composition for lithography according to claim 1, further comprising (F) a surfactant.

9. A resist underlayer film-forming composition for lithography comprising:
(A) an alicyclic epoxy compound having an alicyclic skeleton and one or more epoxy groups, and a light absorption moiety, in the molecule;
(B) a thermal acid generator; and
(C) a solvent; wherein
the alicyclic epoxy compound (A) is a compound containing at least one compound of compounds of the following Formulae (1), (2), and (3):

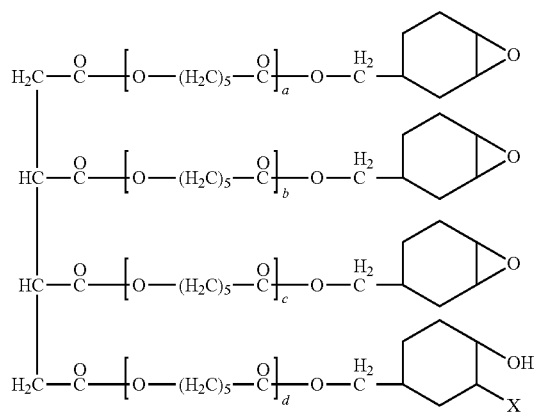
(1)

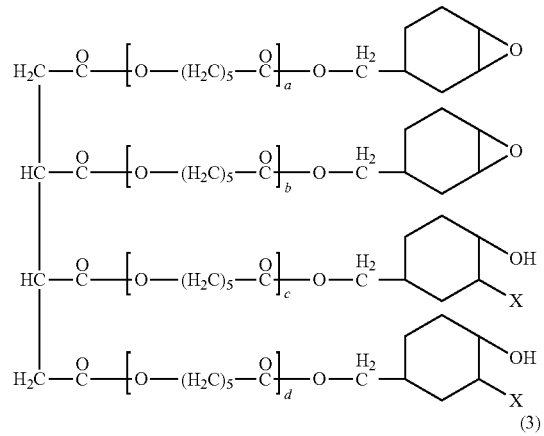
(2)

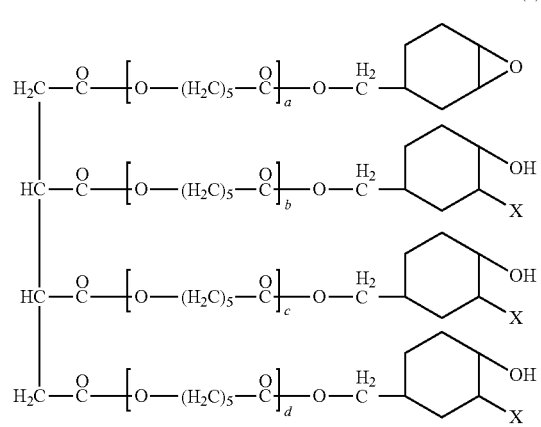
(3)

wherein a, b, c, and d are each independently an integer of 0 to 30, X is any group of the following Formulae (4), (5), (6), and (7):

(4)

(5)

(6)

(7)

wherein $R_1$ to $R_5$ are each independently a hydrogen atom, a $C_{1-10}$ alkyl group, a $C_{3-6}$ alkenyl group, a benzyl group, a phenyl group, a naphthyl group, an anthracenyl group, a triazinyl group, a cyanuric group, a thiadiazolyl group, or a thiazolyl group, the benzyl group, phenyl group, naphthyl group, anthracenyl group, triazinyl group, cyanuric group, thiadiazolyl group, or thiazolyl group may be substituted with at least one group selected from the group consisting of a $C_{1-10}$ alkyl group, a halogen atom, a $C_{1-10}$ alkoxy group, a nitro group, a cyano group, and a $C_{1-10}$ alkylthio group, and $R_3$ and $R_4$ may form a $C_{3-6}$ ring together with a nitrogen atom to which they are bonded, provided that Xs in Formula (2) or (3) may be the same or different and X in at least one of Formulae (1) to (3) is a group in which $R_1$ to $R_5$ are each a benzyl group, a phenyl group, a naphthyl group, an anthracenyl group, a triazinyl group, a cyanuric group, a thiadiazolyl group, or a thiazolyl group.

\* \* \* \* \*